(12) United States Patent
Brehm et al.

(10) Patent No.: US 10,146,048 B2
(45) Date of Patent: Dec. 4, 2018

(54) OPTICAL ASSEMBLY, PROJECTION SYSTEM, METROLOGY SYSTEM AND EUV LITHOGRAPHY APPARATUS

(71) Applicant: Carl Zeiss SMT GmbH, Oberkochen (DE)

(72) Inventors: Michael Brehm, Sulzbach-Laufen (DE); Wolfgang Merkel, Neu-Ulm (DE); Ulrich Weber, Ulm (DE); Henry Wegert, Westhausen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 15/291,631

(22) Filed: Oct. 12, 2016

(65) Prior Publication Data
US 2017/0102539 A1  Apr. 13, 2017

(30) Foreign Application Priority Data
Oct. 12, 2015  (DE) .................. 10 2015 219 671

(51) Int. Cl.
| | |
|---|---|
| *G02B 27/00* | (2006.01) |
| *G02B 5/08* | (2006.01) |
| *G02B 7/182* | (2006.01) |
| *G02B 17/06* | (2006.01) |
| *G03F 7/20* | (2006.01) |

(52) U.S. Cl.
CPC ....... *G02B 27/0006* (2013.01); *G02B 5/0808* (2013.01); *G02B 5/0891* (2013.01); *G02B 7/182* (2013.01); *G02B 17/0652* (2013.01); *G03F 7/7015* (2013.01); *G03F 7/70825* (2013.01); *G03F 7/70933* (2013.01)

(58) Field of Classification Search
USPC ........................................................ 359/509
See application file for complete search history.

(56) References Cited

U.S. PATENT DOCUMENTS

| | | | |
|---|---|---|---|
| 9,244,264 B1 * | 1/2016 | Brown ............... | G02B 17/0808 |
| 2002/0044260 A1 | 4/2002 | Takahashi et al. | |

(Continued)

FOREIGN PATENT DOCUMENTS

| | | |
|---|---|---|
| CN | 102171615 A | 8/2011 |
| CN | 102736442 A | 10/2012 |

(Continued)

OTHER PUBLICATIONS

Office Action in corresponding German Application No. 10 2015 219 671.2, dated Jun. 10, 2016.

(Continued)

*Primary Examiner* — Jennifer D. Carruth
(74) *Attorney, Agent, or Firm* — Edell, Shapiro & Finnan, LLC

(57) ABSTRACT

An optical assembly (1) includes an optical element (2), a mount (3) configured to hold the optical element (2), and a plurality of fastening elements (12) with fastening areas (14) configured to fasten the optical element (2) to the mount (3). The fastening elements (12) bridge an interstice (11) between the optical element (2) and the mount (3), and a purge device (15) produces at least one purge gas flow (16) in the region of the optical element (2) such that the purge gas flow flows around the fastening areas (14) of the fastening elements (12).

22 Claims, 3 Drawing Sheets

(56) References Cited

U.S. PATENT DOCUMENTS

| | | |
|---|---|---|
| 2003/0234989 A1 | 12/2003 | Oshino et al. |
| 2005/0206860 A1 | 9/2005 | Hof et al. |
| 2007/0097500 A1* | 5/2007 | Willey .................. G02B 7/008 359/399 |
| 2008/0304031 A1 | 12/2008 | Kanehira et al. |
| 2009/0027638 A1 | 1/2009 | Van Empel et al. |
| 2010/0195076 A1 | 8/2010 | Mueller et al. |
| 2011/0181852 A1 | 8/2011 | Bleidistel et al. |
| 2012/0002182 A1 | 1/2012 | Nienhuys et al. |
| 2012/0120378 A1 | 5/2012 | Chung |
| 2012/0140328 A1 | 6/2012 | Kwan et al. |
| 2012/0182533 A1 | 7/2012 | Schoeppach et al. |
| 2012/0224153 A1 | 9/2012 | Ehm et al. |
| 2012/0281193 A1 | 11/2012 | Loopstra et al. |
| 2014/0185024 A1 | 7/2014 | Zeller et al. |
| 2014/0204356 A1 | 7/2014 | Bleidistel et al. |
| 2014/0347721 A1 | 11/2014 | Bittner et al. |

FOREIGN PATENT DOCUMENTS

| | | |
|---|---|---|
| DE | 102009029282 A1 | 3/2011 |
| JP | 2002083766 A | 3/2002 |
| JP | 2004031491 A | 1/2004 |
| JP | 2005019628 A | 1/2005 |
| JP | 2006194690 A | 7/2006 |
| JP | 2008263173 A | 10/2008 |
| JP | 2009081465 A | 4/2009 |
| JP | 2011135078 A | 7/2011 |
| JP | 2012222356 A | 11/2012 |
| JP | 2013500593 A | 1/2013 |
| JP | 2013504218 T | 2/2013 |
| JP | 2013506978 A | 2/2013 |
| JP | 2014160241 A | 9/2014 |
| KR | 20050044800 A | 5/2005 |
| KR | 20140089356 A | 7/2014 |
| TW | 201337324 A | 9/2013 |
| WO | 2006069725 A1 | 7/2006 |
| WO | 2006059636 A1 | 8/2008 |
| WO | 2008029852 A1 | 1/2010 |
| WO | 2011029761 A1 | 3/2011 |
| WO | 2011068249 A2 | 6/2011 |
| WO | 2012101269 A1 | 8/2012 |
| WO | 2013174686 A1 | 11/2013 |
| WO | 2015090862 A1 | 6/2015 |

OTHER PUBLICATIONS

Office Action in corresponding Korean Application 1020160131235, dated Sep. 14, 2017, along with English Translation.

Office Action in corresponding Japanese Application 2016196703, dated Dec. 5, 2017, along with English Translation.

Office Action in corresponding Taiwanese Application 105132538, dated Aug. 21, 2017, along with English Translation.

Search Report in Taiwanese Application No. 105132538, completed Aug. 18, 2017.

Office Action in corresponding Taiwanese Application 105132538, dated Apr. 3, 2018, along with English Translation.

Japanese Office Action with English Translation, dated Jul. 2, 2018, 12 pages.

* cited by examiner

OPTICAL ASSEMBLY, PROJECTION SYSTEM, METROLOGY SYSTEM AND EUV LITHOGRAPHY APPARATUS

CROSS REFERENCE TO RELATED APPLICATION

This application claims the priority of the German patent application DE 10 2015 219 671.2 dated Oct. 12, 2015, the entire disclosure of which is made to be the content of this application by reference.

FIELD OF THE INVENTION

The invention relates to an optical assembly comprising: an optical element, a mount configured to hold the optical element, and a plurality of fastening elements with fastening areas configured to fasten the optical element to the mount, wherein the fastening elements bridge an interstice between the optical element and the mount. The invention also relates to a projection system comprising such an assembly, and a metrology system and a lithography apparatus configured for extreme ultraviolet light (EUV) comprising such a projection system.

BACKGROUND

The use of fastening elements, which have fastening areas at which the optical element is fastened, is known for the purposes of holding optical elements on a mount. The optical element can be fastened to the fastening elements with a joining agent, for example with an adhesive. In general, the optical element lies on the fastening elements in the region of the fastening areas in order to support the optical element at the outer edge; however, it is also possible for the fastening elements to have lateral fastening areas in order to laterally clamp the optical element and thus achieve fastening in this manner. By way of example, the fastening elements may be embodied in the way of webs or the like, which possibly bridge an interstice between the inner edge of the mount and the outer edge of the optical element.

When use is made of UV or EUV radiation, it is generally necessary to protect optically active surfaces of optical elements using purge gas flows, since contaminations of the optically active surfaces may lead to transmission losses and irreversible damage of the optical elements. Particularly when using radiation at wavelengths of less than approximately 200 nm, it is advantageous to use small purge gas flows or a small purge gas volume per unit time. This is so because a noble gas, e.g. argon, must in some cases be used as the purge gas for the used radiation because of the absorption lines resulting from the purge gas.

By way of example, for the purposes of producing purge gas flows along optical surfaces, WO 2015/090862 A1 discloses the practice of providing at least one gas nozzle for producing a gas flow in an EUV lithography system for the purposes of removing contaminating substances from an optical surface arranged in the EUV lithography system, said gas flow forming a gas eddy in the EUV lithography system. The gas flow may extend along an optical surface such that the gas eddies are guided along the optical surface.

US 2010/0195076 A1 discloses an optical membrane element for an optical device for lithography, said membrane element having at least one membrane layer and a mount, which at least partly surrounds the at least one membrane layer and on which at least part of the edge of the membrane layer is fastened. Provision is made for at least one tensioning element for clamping the membrane in an adjustable manner. The optical membrane element has a holder, in which the mount is received, and the tensioning element has a length-adjustable connecting element between the mount and the holder. The membrane layer may be fastened to the holder in a gas-tight manner such that no membrane-free space remains between the contact points of the fastening elements on the membrane and on the holder.

SUMMARY

It is an object of the invention to provide an optical assembly, a projection system comprising such an optical assembly, a metrology system and an EUV lithography apparatus comprising such a projection system, in which the purging of the optical element with a purge gas is improved.

This object is achieved with an optical assembly of the type set forth in the introduction, which comprises a purging device arranged to produce at least one purge gas flow in the region of the optical element, such that the purge gas flow flows around the fastening areas of the fastening elements. By having the purge gas flow flowing around the fastening areas or by arranging the fastening areas in the volume purged by the purge gas, it is possible to protect these from ambient influences, in particular from moisture.

In one embodiment, the purge device is embodied to produce a purge gas flow which passes through the interstice. What is proposed to protect the fastening areas from influences from the surroundings, in particular from moisture, in accordance with this embodiment is to guide a (dry) purge gas flow through the interstice or to allow it to pass through the interstice. This renders it possible to protect the fastening areas from moisture. However, as a rule, this solution requires a comparatively large amount of purge gas if the optically used region of the optical element should also be purged by a purge gas flow at the same time.

In a further embodiment, a—typically plate-shaped—flow guiding element is fastened, outside of an optically used region, to the optical element and/or to the mount, and covers the interstice between the optical element and the mount in a planar manner, typically completely. What can be achieved by the planar covering of the interstice by the flow guiding element is that the amount of purge gas which flows through the interstice is significantly reduced but a sufficient flow around the fastening areas of the fastening elements is nevertheless ensured.

In a further embodiment, the flow guiding element consists of a metallic material, for example stainless steel. The flow guiding element may be a self-supporting element, for example in the form of a sheet, or a non-self-supporting element, e.g. in the form of a membrane. Since the flow guiding element is fastened to the mount and/or, outside of the optically used area, to the optical element, it is not necessary for it to be formed from a material which is transparent to the used radiation of the optical assembly.

The material of the flow guiding element should be selected in such a way that, firstly, it does not outgas contaminating substances into the surroundings and, secondly, it is stable for stray radiation at the wavelength of the used radiation, which may reach the flow guiding element, over a long period of time such that the material of the flow guiding element does not degrade. Both requirements are typically satisfied by metallic materials, specifically stainless steel. It is understood that the flow guiding element, in particular in the form of a membrane, may also be formed from other materials, for example from materials which are used for producing so-called pellicles, which are used in lithography for protecting wafers or masks from contaminating substances. In particular, a suitable material for the flow guiding element may be selected in a manner dependent on the wavelength of the used radiation. In particular, a material with a lower rigidity than the material of the mount may be selected as material for the flow guiding element.

In a further embodiment, the flow guiding element seals the interstice in a gas-tight manner. In this embodiment, the interstice between the optical element and the mount is completely covered by the flow guiding element, which consists of a gas-tight, e.g. metallic material, such that the flow guiding element seals the interstice in a gas-tight manner. Hence, the flow guiding element completely seals the interstice between the optical element and the mount such that the fastening areas, and also the fastening elements, are protected from environmental influences, which may occur at the side of the flow guiding element distant from the fastening faces. Moreover, by sealing the interstice, it is possible to prevent the purge gas flow, which is guided through the interstice, possibly causing turbulence when it impinges on a further purge gas flow or crosses a further purge gas flow which may be provided for e.g. protecting a further optical element in an optical system, e.g. an imaging optical system, containing the optical assembly.

Typically, the fastening elements, which may be e.g. web-shaped fastening elements (so-called "feet"), extend on that side of the flow guiding element along which the purge gas is also guided along the optical element. Hence, the purge gas flow can be guided along the fastening elements and, in particular, along the fastening areas in order to protect these from moisture and other environmental influences, without some of the purge gas flow being able to escape through the interstice. Therefore, the amount of purge gas required by the purge device can be significantly reduced when completely sealing the interstice by the flow guiding element since it is only necessary to purge the volume on that side of the optical element on which the optically used region is formed as well. Typically, a significantly higher protection factor can be obtained by sealing the interstice with the aid of the flow guiding element when compared with the embodiment described further above. The protection factor describes the ratio of the contamination of the ambient gas (generally air) relative to the ratio of contamination of the purge gas (nitrogen, argon, etc.). By way of example, if 10 000 oxygen molecules are present in the ambient air in a given volume as contamination and if only one oxygen molecule can be found in the same volume in the purge gas in the optical system, then the protection factor is 10 000:1.

In one embodiment, the optical element is fastened to fastening areas of the fastening elements with a joining agent, in particular with an adhesive. The adhesive connection can be changed in terms of the properties thereof by environmental influences, in particular by moisture. By taking up moisture, the volume of the adhesive may increase, i.e. the adhesive may swell up, as a result of which there is a change in the alignment of the optical element relative to the mount and the optical system, into which the optical element or the optical assembly has been installed, has an unwanted deterioration in terms of the optical properties thereof. Such a change in the orientation or a deformation of the typically comparatively thin optical element may optionally also occur when it is fastened to the mount or to fastening areas of the fastening elements in a different manner than by way of a cohesive connection. The fastening elements may have an integral design with the mount; however, it is also possible for the fastening elements to be fastened to the mount by way of a cohesive or force-fit or interlocking connection.

In one embodiment, the optical element is a mirror element, which has a substrate and a reflecting coating applied to the substrate. The optically used region of the mirror either forms a portion of the reflecting coating or corresponds to the region in which the reflecting coating is applied to the substrate. The reflecting coating may be applied to a surface of the substrate which is planar or optionally curved in a convex or concave manner. The purge device is typically embodied to guide the purge gas flow, or a purge gas flow, along the optically used region of the reflecting coating.

Instead of a mirror, the optical element may also be a transmissive optical element, for example a lens element. A transmissive optical element also has an optically used region, in which radiation passes through the optical element in a directed manner. In this case too, the membrane may be fastened to the optical element outside of the optically used region.

In one development, the flow guiding element is fastened to a side of the substrate facing away from the reflecting coating (i.e. the rear side). In this case, the fastening elements typically extend on that side of the flow guiding element which faces the reflecting coating. Since the optical element, more precisely the optically used region, is purged by a purge gas, the purge gas flow also flows around the fastening areas and therefore protects these from influences from the environment. Alternatively, it is also possible to fasten the flow guiding element to the optical element on the side facing the reflecting coating. In this case, it is advantageous to produce a purge gas flow which extends along the rear side of the mirror or the substrate in order to protect the fastening areas from environmental influences.

There are various options for fastening the flow guiding element to the optical element and/or to the mount. Preferably, the flow guiding element is fastened to the optical element outside of the optically used region and/or to the mount with a joining agent, in particular with an adhesive.

In one embodiment, the flow guiding element is embodied as a membrane which is fastened to the optical element and to the mount outside of the optically used region. The membrane is typically not self-supporting, and so it is fastened both to the mount and to the optical element. However, it is also understood that a self-supporting flow guiding element, e.g. in the form of a thin sheet, may be fastened to both the optical element and the mount if it is used to seal the interstice in a gas-tight manner.

In one development, the membrane is fastened to the optical element outside of the optically used region with a joining agent, in particular with an adhesive. Such fastening, firstly, renders it possible to fasten the membrane without deforming the optical element and, secondly, typically enables a completely sealing connection between the membrane and the optical element. The e.g. (circular-)ring-shaped membrane may also be adhesively bonded to the mount in a completely sealing manner. Moreover, an adhesive connection only requires little installation space since the thickness of the adhesive layers may be e.g. approximately 20-30 µm or less. By way of example, an adhesive based on an epoxy resin may be used for the adhesive bonding. Ideally, the adhesive is only applied onto the optical element in an outermost edge region so as not to produce any deformations in the optically used region. In place of an adhesive it may also be possible to use other joining agents, optionally dependent on the materials to be connected, which enable a cohesive connection, for example a solder paste or the like. Fastening of the membrane or the flow guiding element to the optical element and/or to the mount is also possible by way of a force fit or in an interlocking manner.

In a further development, the joining agent, in particular the adhesive, is applied in the form of a zigzag track onto the optical element. In this case, the adhesive is applied onto the optical element along an edge region in a circumferential fashion, typically in a circular-ring-shaped manner, wherein the mutually opposing tips of the zigzag track represent the inner or outer maximum extent thereof in the radial direction. By applying the adhesive in the form of a zigzag track, it is possible to prevent a radially inwardly or, optionally, radially outwardly acting force from being exerted onto the optical element when the adhesive cures. For the purposes of producing an adhesive bond which is as defined as possible and metered exactly, it is advantageous to apply the adhesive onto the optical element not, as is usual, using a syringe, but rather through a screen printing method. It is understood that it is also possible to fasten a flow guiding element which is not embodied as a membrane onto the optical element with an adhesive which is embodied in the form of a zigzag track.

A small positive pressure relative to the ambient air pressure prevails in the purged volume, which is typically formed on the side of the substrate with the reflecting coating, even in the case where the purge gas passes through the interstice, such that a constant outflow of the purge gas is ensured. This outflow must have a speed which is higher than the mean diffusion speed in order to effectively prevent the ingress of contaminants into the purged volume. The optical element experiences a resulting tensile force, which acts in the direction of the rear side of the optical element and in the radial direction, as a result of the positive pressure which is exerted by the purge gas onto the optical element and by the resistance of the fastening elements. It is therefore possibly advantageous to fasten the membrane to the optical element under the generation of a radial pretension in order to at least partly compensate a pressure-induced arching of the optical element toward the outside. The pretension can be produced by the shrinking of the adhesive when curing. In this case, the adhesive is typically not applied onto the optical element in the form of a zigzag track, as described above, but instead in the form of a circular-ring-shaped track with typically a constant diameter.

In a further embodiment, the membrane has a thickness of less than 50 μm. The membrane may be embodied in a very thin manner and a thickness of possibly less than 10 μm. Hence, the membrane may be significantly thinner than the thinnest portions of the typically web-shaped fastening elements, and so the membrane fastened to the optical element typically cannot lead to significant tilt or decentration of the optical element. Attaching the membrane e.g. on the lower side of a mirror, which has an opening, only requires little installation space, and so a component, for example a further mirror, which is impinged upon by the used radiation passing through the opening, can be arranged with little distance from the rear side of the mirror. Hence, the free working distance of the optical element is only marginally reduced. The provision of a purge channel which leads along the rear side of the mirror would, by contrast, possibly require a significantly larger installation space.

In an alternative embodiment, a preferably ring-shaped gap is formed between the flow guiding element and the optical element, or between the flow guiding element and the mount, for the passage of the purge gas flow. Here, the gap runs outside of the typically ring-shaped interstice which is covered by the flow guiding element in a planar manner. In this case, the flow guiding element is a self-supporting, typically plate-shaped component, for example a sheet which is fastened to the mount but not to the optical element, or vice versa. The purge gas flow can reach from one side of the optical element to the other side of the optical element through the typically ring-shaped gap. The gap has a gap width which is typically significantly smaller than the width of the interstice, with the gap width typically lying at less than 200 μm, preferably at less than 20 μm. As a result of the (narrow) gap, the purge gas flow from one side of the optical element to the other side is significantly reduced compared to the case where the purge gas flow passes directly, i.e. without a flow guiding element, through the interstice, without the protection factor being (significantly) reduced hereby. Even though the gap is typically circumferential in a ring-shaped manner, it is optionally also possible for the gap to be interrupted in the circumferential direction, i.e. for the flow guiding element to contact the optical element in the circumferential direction, at least along a portion, or for it to be fastened to the optical element in said portion.

Preferably, the mount and/or the optical element has/have a recess for receiving the (plate-shaped) flow guiding element in this embodiment. By way of example, the mount and/or the optical element may have a projection or a step, the height of which substantially corresponds to the thickness of the (plate-shaped) flow guiding element (optionally including the width of the ring-shaped gap). In this way, the flow guiding element can be integrated into the mount or into the optical element such that it terminates flush with the mount or with the optical element, or possibly only projects slightly beyond the optical element or beyond the mount.

In one development, the optical element has at least one opening in the optically used region. The optical element may, in particular, be a mirror, in the reflecting coating of which an opening for the passage of radiation has been formed. In particular, the opening may be formed centrally in a circular, possibly concavely or convexly curved, surface of the substrate, on which the reflecting coating has been applied. Such mirrors, which have a continuous opening, may be used, for example, in optical systems which are used in metrology systems for lithography, inspection systems or EUV lithography apparatuses. The, or individual, mirrors used therein have a comparatively low thickness and may be fastened to a mount in the manner described further above. Such mirrors may optionally have more than one opening, through which the, or a, purge gas flow may pass.

In one embodiment, the optical assembly additionally comprises a transparent membrane which completely covers the opening. In addition, or as an alternative, to the membrane which is generally not transparent to the used radiation and which completely covers the interstice, the opening in the optical element may also be covered by an (optionally further) transparent membrane. In this manner, the purge gas flow may be guided along only one side of the optical element, even in the case of an optical element which has an opening. Within the meaning of this application, a transparent membrane is understood to mean a membrane which consists of material that is transparent to the wavelength(s) of the used radiation of the optical system, into which the optical assembly has been inserted. The used radiation is typically UV radiation with wavelengths of less than approximately 200 nm. If radiation in the EUV wavelength range between approximately 5 nm and approximately 35 nm is used as used radiation, the transparent membrane is embodied sufficiently thin, as practically no transparent materials exist for radiation at these wavelengths. In this case, the transparent membrane has a sufficiently low thickness such that, nevertheless, a significant portion of the EUV radiation may pass through the transparent membrane.

In a further, alternative embodiment, the purge device is embodied to produce a purge gas flow which passes through the opening. By way of example, the purge gas flow may be aligned onto the optical element substantially perpendicular to, or slightly obliquely in, the direction of the opening in a radially outer lying edge region, which is situated outside of the optically used region. In the case of a suitable alignment of the purge gas flow, the latter is guided along the optically used region into the center of the optically used region, or to the location of the opening, and passes through the opening formed there. For the purposes of guiding the purge gas flow, the purge device may have flow guiding devices which guide or deflect the purge gas flow in the direction of the opening.

In one development, the purge device has a distributor device for distributing a purge gas among a first purge gas flow, preferably guided through the opening, and a second purge gas flow, guided in the interstice. Typically, no flow guiding element sealing the interstice in a completely gas-tight manner is provided in this embodiment. A purge gas, which is e.g. provided by a purge gas reservoir, may be split into two purge gas flows by the distributor device. To this end, the distributor device may have e.g. flow guide elements.

In one development, the distributor device has two flow guiding elements, which are arranged at a distance from the optical element, wherein a gap is formed in each case between a respective flow guiding element and the optical element and wherein the purge device is embodied to allow the purge gas to flow in between the two flow guiding elements in the direction of the optical element for the purposes of distribution between the two purge gas flows. The flow guiding elements can act in the way of a gas seal ("leaky seal") and, for this purpose, are typically arranged with a small distance from the optical element such that a gap is formed between a respective flow guiding element and the optical element. The purge gas is guided between the two flow guiding elements in the direction of the optical element and distributed among the two gaps between the flow guiding elements and the optical element. The width of the respective gap, and hence the portion of the purge gas fed to one of the two purge gas flows, may be adjusted by way of the distance between a respective flow guiding element and the optical element. It is understood that it is typically necessary to arrange the two flow guiding elements outside of the optically used region of the optical element, typically in a circumferential edge region of the optical element.

A further aspect of the invention relates to a projection system which has at least one optical assembly which is embodied as described further above. In particular, the assembly described further above may have an optical element in the form of a mirror with an opening or a (central) hole. Such mirrors may be used in projection systems for lithography applications, for example in order to realize a pupil obscuration. As is conventional in projection systems, these serve to image an object in an object field onto an image in an image field, with the imaging typically being carried out with an increased or reduced scale.

A further aspect of the invention relates to an EUV lithography apparatus which has a projection system which is embodied as described further above. An EUV lithography apparatus which comprises an obscured projection system is described in e.g. WO 2006/069725 A1, which is included by reference in the content of this application in its entirety.

A further aspect of the invention relates to a microlithographic metrology system or inspection system, which has at least one optical assembly which is embodied as described further above and may be arranged e.g. in a projection lens. An object, for example a mask or wafer, is illuminated with the aid of a metrology system and typically imaged with an increased scale on a detector with the aid of a projection system. Examples of metrology systems, which have a projection system with a mirror with at least one opening, have been disclosed in e.g. WO 2012/101269 A1 and WO 2013/174686 A1, which are included in the content of this application in the entirety thereof by reference. Optionally, the optical assembly may also be arranged in a microlithographic inspection system, for example for inspecting a wafer or a mask, which does not have a projection system.

Further features and advantages of the invention emerge from the following description of exemplary embodiments of the invention, on the basis of the figures in the drawing, which show details essential to the invention, and from the claims. The individual features can be realized respectively on their own or together in any combination in one variant of the invention.

BRIEF DESCRIPTION OF THE DRAWINGS

Exemplary embodiments are illustrated in the schematic drawing and are explained in the following description. In the figures.

Identical reference signs are used in the following description of the drawings for equivalent or functionally equivalent components.

DETAILED DESCRIPTION

Figure 1:
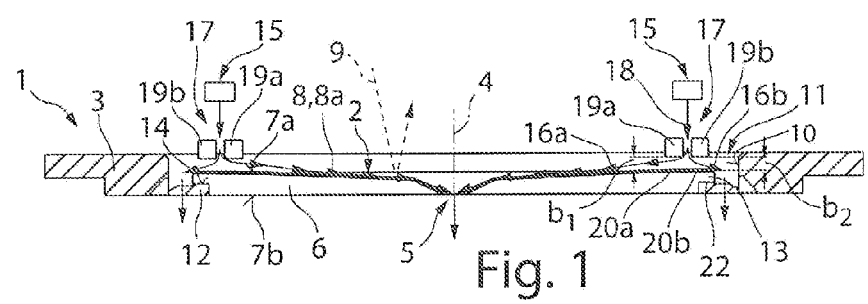
FIG. 1 shows a schematic illustration of an optical assembly with a purge device, which produces a purge gas flow which passes through an interstice between an optical element and a mount.

FIG. 1 schematically shows an optical assembly 1, which has an optical element in the form of a mirror 2 and a mount 3 for holding the mirror 2. In the shown example, the mirror 2 has a rotationally symmetric design in relation to a central axis 4, which extends through the center of the mirror 2. In the region of the central axis 4, the mirror 2 has a central opening 5 in the form of a circular hole. The mirror 2 is formed from a substrate 6, on the concave curved upper side 7a of which a reflecting coating 8 is applied in order to reflect used radiation 9. The area on the upper side 7a of the mirror 2, which is coated by the reflecting coating 8, is circular and a radially inner optically used region 8a of the mirror 2 is formed therein. In FIG. 1, the reflecting coating 8 extends in the radial direction to the outer edge of the mirror 2. However, it is understood that the reflecting coating 8 may optionally not extend up to the outer edge of the mirror 2 in the radial direction, with only the portion on the upper side 7a, onto which the reflecting coating 8 is applied, forming the optically used region 8a of the mirror 2 in this case.

The used radiation 9 may be e.g. UV radiation with wavelengths of typically less than approximately 200 nm or EUV radiation with wavelengths which typically lie between approximately 5 nm and approximately 35 nm. If the used radiation 9 is UV radiation, it is possible, for example, to use (synthetic) fused silica ($SiO_2$) or calcium fluoride ($CaF_2$) as material for the substrate 6. If the used radiation 9 is EUV radiation, a so-called zero expansion material, e.g. ULE® or Zerodur®, is typically used as material for the substrate 6. In the case of applications which place slightly lower requirements on the dimensional stability of the substrate 6 in the case of temperature variations, it is also possible to use metals, metal alloys, silicon or SiSiC as materials for the substrate 6 of the mirror 1. In both cases, the reflecting coating 8 typically has a plurality of individual layers, which alternately consist of materials with a high refractive index and a low refractive index for the used radiation 9. On the lower side 7b thereof, the substrate 6 is planar and terminates substantially flush with the lower side of the mount 3.

In the shown example, the mount 3 has a substantially circular-ring-shaped design and a circularly circumferential inner edge 10. A circular-ring-shaped interstice 11 is formed between the inner edge 10 of the mount 3 and an outer, likewise circular edge of the mirror 2. The interstice 11 is bridged by a plurality of web-shaped fastening elements 12, which are arranged in the circumferential direction with a regular distribution about the central axis 4. Proceeding from the mount 3 in each case, the fastening elements 12 extend in the radial direction towards the mirror 2. The fastening elements 12 (which are also referred to as webs or feet) have a portion extending parallel to the inner edge 10 of the mount 3, with said fastening elements 12 having a minimum thickness, which may be approximately 500 μm, at said portion in order to enable an elastic mount of the mirror 2 on the mount 3.

On its outer edge, the mirror 2 has a circumferential collar-shaped portion 13 (projection), on the lower side of which the fastening elements 12 abut. More precisely, the mirror 2 rests at the collar-shaped portion 13 on fastening areas 14 which are formed on the upper side of the fastening elements 12. A joining agent in the form of an adhesive 22 has been introduced between the fastening areas 14 and the lower side of the collar-shaped portion 13 in order to permanently connect the mirror 2 to the mount 3, or to fix the mirror and thus prevent a misalignment of the mirror 2 by way of lateral tilting or slipping of the mirror 2.

The optical assembly 1 has a purge device 15 which, in the shown example, is arranged in the region of the upper side 7a of the mirror 2 and embodied to produce a first purge gas flow 16a and a second purge gas flow 16b. The first purge gas flow 16a extends in the radial direction from out to in along the reflecting coating 8, at which the radially inner optically used region 8a of the mirror 2 is formed, and passes through the central, continuous opening 5 of the mirror 2 to the rear side 7b thereof. The second purge gas flow 16b extends radially outwardly along the outer edge of the mirror 2, is deflected at the inner edge 10 of the mount 3 and passes through the interstice 11, which is formed between the mirror 2 and the mount 3, to the rear side 7b of the mirror 2.

The first purge gas flow 16a serves to purge the reflecting coating 8 or the optically used region 8a in order to keep contaminating substances away therefrom. The second purge gas flow 16b serves to flow around the fastening areas 14 of the fastening elements 12 such that these do not come into contact with moisture from the surroundings. This is advantageous because the adhesive 22, which is e.g. based on an epoxy resin, may swell up by the inclusion of water, as a result of which the alignment of the mirror 2 may change.

In the example shown in FIG. 1, the purge device 15 for producing the two purge gas flows 16a, 16b has a distributor device 17 for distributing a purge gas 18 among the first purge gas flow 16a and the second purge gas flow 16b. By way of example, the purge gas 18 can be taken from a purge gas reservoir indicated in FIG. 1 by a rectangle. By way of example, the purge gas 18 may be nitrogen or a noble gas, e.g. argon; hydrogen may also be used as purge gas 18, particularly in the case of used radiation 9 in the EUV wavelength range.

In the shown example, the distributor device 17 has two flow guiding elements 19a, 19b which are embodied in the form of circular rings with a rectangular cross section. The two ring-shaped flow guiding elements 19a, 19b are arranged at a distance from the upper side 7a of the mirror 2, to be precise in a radially outer portion of the mirror 2 outside of the inner, optically used region 8a. The flow guiding elements 19a, 19b only have a small distance from the upper side 7a of the mirror 2 such that a gap 20a, 20b with a width $b_1$, $b_2$ is respectively formed between a respective flow guiding element 19a, 19b and the upper side 7a of the mirror 2, which width may be e.g. of the order of approximately 0.1 mm.

The purge device 15 has a supply line (not shown here) in order to allow the purge gas 18 to flow between the two flow guiding elements 19a, 19b from the reservoir in the direction of the mirror 2, more precisely onto the upper side 7a thereof. The upper side 7a of the mirror 2 serves as impact area for the purge gas 18, which is divided among the two ring-shaped gaps 20a, 20b such that the two purge gas flows 16a, 16b are formed. It is possible to adjust, or set in advance, the amount of purge gas 18 which is apportioned at a respective purge gas flow 16a, 16b by setting the widths b1, b2 of the respective gaps 20a, 20b.

In the example of an optical assembly 1 shown in FIG. 1, use is made of two purge gas flows 16a, 16b to purge the mirror 2 both at the optically used region 8a and at the fastening areas 14, and so a comparatively large amount of purge gas 18 is required. In the example of an optical assembly 1 shown in FIGS. 2A-2C, the purge device 15 produces only a single purge gas flow 16, the course of which substantially corresponds to the first purge gas flow 16a described in conjunction with FIG. 1, i.e. the purge gas flow 16 is guided along the optically used region 8a or along the reflecting coating 8 at the upper side 7a of the mirror 2. To this end, the purge device 15 may have an e.g. ring-shaped gas nozzle, the outlet opening of which is aligned at an angle to the upper side 7a of the mirror 2, as depicted schematically in FIG. 2A.

Figure 2A:
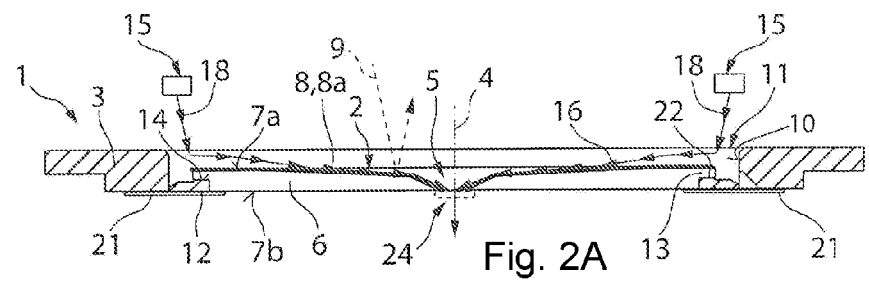
FIGS. 2A-2C show schematic illustrations of an optical assembly analogous to FIG. 1, in which the interstice is completely covered by a flow guiding element in the form of a gas-tight membrane.
Figures 2B, 2C:
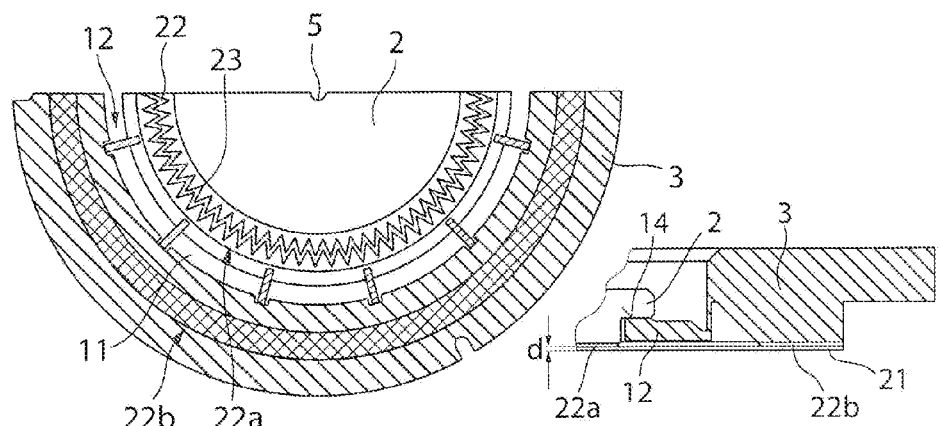

In the example shown in FIGS. 2A-2C, the ring-shaped interstice 11 between the mirror 2 and the mount 3 is completely covered by a flow guiding element in the form of a membrane 21 which, in the shown example, is fastened to the lower side 7b of the mirror 2 and to the mount 3. The membrane 21 consists of a metallic material—stainless steel in the shown example—and seals the interstice 11 between the mount 3 and the mirror 2 in a gas-tight manner.

In order to seal the interstice 11 in a gas-tight manner, the membrane 21 is fastened to the lower side 7b of the mirror 2 and to the mount 3 with an adhesive 22, more precisely with a respective adhesive layer 22a, 22b, as can easily be identified in FIG. 2C. The second adhesive layer 22b for connecting the membrane 21 to the mount 3 has a circular-ring shape and is applied in a planar manner onto the lower side of the mount 3, as can be identified in FIG. 2B and FIG. 2C, which show, respectively, half of the optical assembly 1 from the lower side (without the membrane 21) and a detail of the optical assembly 1 in a sectional view. The first adhesive layer 22a on the lower side 7b of the mirror 2 has not been applied in a planar manner, but in the form of a zigzag track 23, as can be identified in FIG. 2B. The zigzag-shaped application of the adhesive 22 or of the adhesive layer 22a on the mirror 2 renders it possible to prevent the occurrence of a radially inwardly acting tension which, in the case of a planar application of the adhesive 22 or the first adhesive layer 22a on the mirror 2, may occur due to shrinkage of the volume of the adhesive 22 when the latter cures. The zigzag track 23 has a circular-ring-shaped extent, with peaks of the zigzag track 23 lying opposite one another representing the maximum inward or outward extent thereof in the radial direction. In the present example, the zigzag track 23 is applied to the lower side 7b of the mirror 2 using a screen printing method in order to facilitate precise metering of the adhesive 22. It is understood that the adhesive 22 may optionally also be applied using a syringe where necessary, to the extent that this facilitates precise metering of the adhesive 22 for producing the zigzag track 23. As can likewise be identified in FIG. 2B, the adhesive 22 is only applied onto the lower side 7b of the mirror 2 in a radially outer region, adjacent to the edge of the mirror 2, in order not to produce any deformations within the optically used region 8a of the mirror 2.

As can be identified, in particular in FIG. 2C, the membrane 21 has a small thickness d of less than approximately 50 μm, between approximately 5 μm and approximately 20 μm in the shown example. The adhesive layers 22a, 22b respectively also have a small thickness of the order of e.g. approximately 20 μm. Therefore, the membrane 21 only requires very little space such that further optical elements or components, which are arranged below the optical assembly 1, can be arranged at a small distance from the mirror 2 or the optical assembly 1. Moreover, the membrane 21 facilitates effective protection or effective shielding of the fastening areas 14 of the fastening elements 12, and so the protection factor is increased. When using the membrane 21, the fastening areas 14 also lie in the volume purged by the purge gas flow 16, and so these are protected by the purge gas flow 16 and no humidity can reach the fastening areas 14.

The opening 5 in the mirror 2 serves for the passage of the used radiation 9 onto further components, for example onto an object, e.g. in the form of a mask or a wafer, or onto an optical element, for example in the form of a further mirror, as is described in more detail further below. The opening 5 may be completely covered by a further membrane 24, which is depicted in a dotted manner in FIG. 2a and which completely covers the opening 5. The further membrane 24 is transparent to the used radiation 9, i.e. the further membrane 24 transmits a significant portion (>95%, in particular >99%) of the used radiation 9 incident thereon. To this end, the further membrane 24 may be formed from a material that is transparent to the used radiation 9. There are practically no transparent materials for used radiation 9 in the EUV wavelength range, and so the further membrane 24 should be particularly thin in order to absorb only a portion of the used radiation 9 that is as small as possible. For the further membrane 24 and for the membrane 21, which completely covers the interstice 11, it is possible to use materials, in particular, which are used for the production of a so-called pellicle, for example the materials described in US 2010/0195076 A1 cited at the outset, i.e. Si, Zr, Ru, Rh, Nb, Mo, B or silicon nitride.

If use is made of the transparent membrane 24, the purge gas flow 16—unlike what is shown in FIG. 2A—does not pass through the opening 5 but instead extends along the upper side 7a of the mirror 2. In this case, the upper side 7a and the lower side 7b of the mirror 2 of the optical assembly 1 are completely separated from one another in a gas-tight manner, and so the purge gas flow 16 on the upper side 7a of the mirror 2 cannot collide with further purge gas flows, present as required, which serve for purging further assemblies arranged at the lower side of the optical assembly 1.

Figure 3:
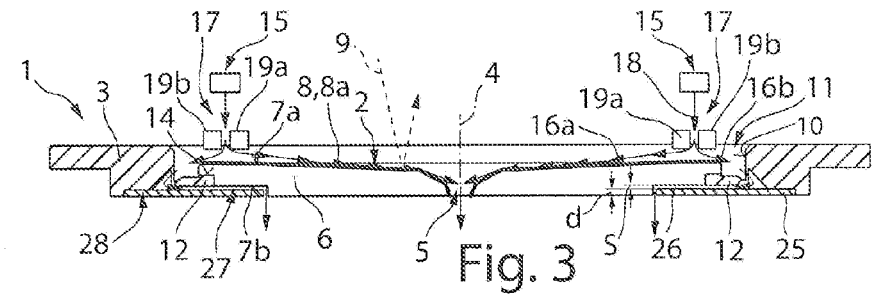
FIG. 3 shows schematic illustrations of an optical assembly analogous to FIG. 1 and FIGS. 2A-2C, in which a ring-shaped gap is formed between the optical element and a flow guiding element in the form of a sheet, which covers the interstice.

FIG. 3 shows a further embodiment of the optical assembly 1, which has a distributor device 17 embodied like in FIG. 1 in order to produce a first purge gas flow 16a and a second purge gas flow 16b. The optical assembly 1 of FIG. 3 has a flow guiding element in the form of a flow guiding metal sheet 25, which covers the interstice 11 in a planar manner. The flow guiding metal sheet 25 is fastened to the mount 3, but not to the optical element 2. The flow guiding metal sheet 25 overlaps with the lower side 7b of the optical element 2, and so a gap 26 is formed between the optical element 2, more precisely the lower side 7b thereof, and the flow guiding metal sheet 25. Unlike the example shown in FIGS. 2A-2C, the flow guiding metal sheet 25 does not completely separate the airspace on the upper side 7a of the optical element 2 from the airspace on the lower side 7b of the optical element 2 in a gas-tight manner. The second purge gas flow 16b passes through the (narrow) gap 26, which e.g. may have a width of less than 100 μm, with a comparatively low flow rate in order to protect the airspace on the upper side 7a of the optical element 2 and the fastening areas 14 at the web-like fastening elements 12 from contamination from the airspace on the lower side 7b of the optical element 2.

In order to use up as little installation space as possible on the lower side 7b of the optical element 2, the lower side 7b of the optical element 2 has a stepped embodiment and a recess 27, the height of which substantially corresponds to the sum of the thickness d of the flow guiding metal sheet 25, e.g. approximately 1 mm, and the gap width S of the ring-shaped gap 26. In the radial direction, the recess 27 extends slightly further to the inside (by the gap width S) than the free end of the flow guiding metal sheet 25, and so the gap 26 kinks downward at the free end of the flow guiding metal sheet 25. The flow guiding metal sheet 25 is fastened to the mount 3 with an adhesive (not shown here). In order to keep the required installation space as small as possible, the mount 3 likewise has a recess 28 on the lower side thereof, the height of the mount corresponding to the thickness of the flow guiding metal sheet 25. Hence, the flow guiding metal sheet 25 terminates flush with the lower side 7b of the optical element 2 and with the lower side of the mount 3, and so no additional installation space is required.

Figure 4:
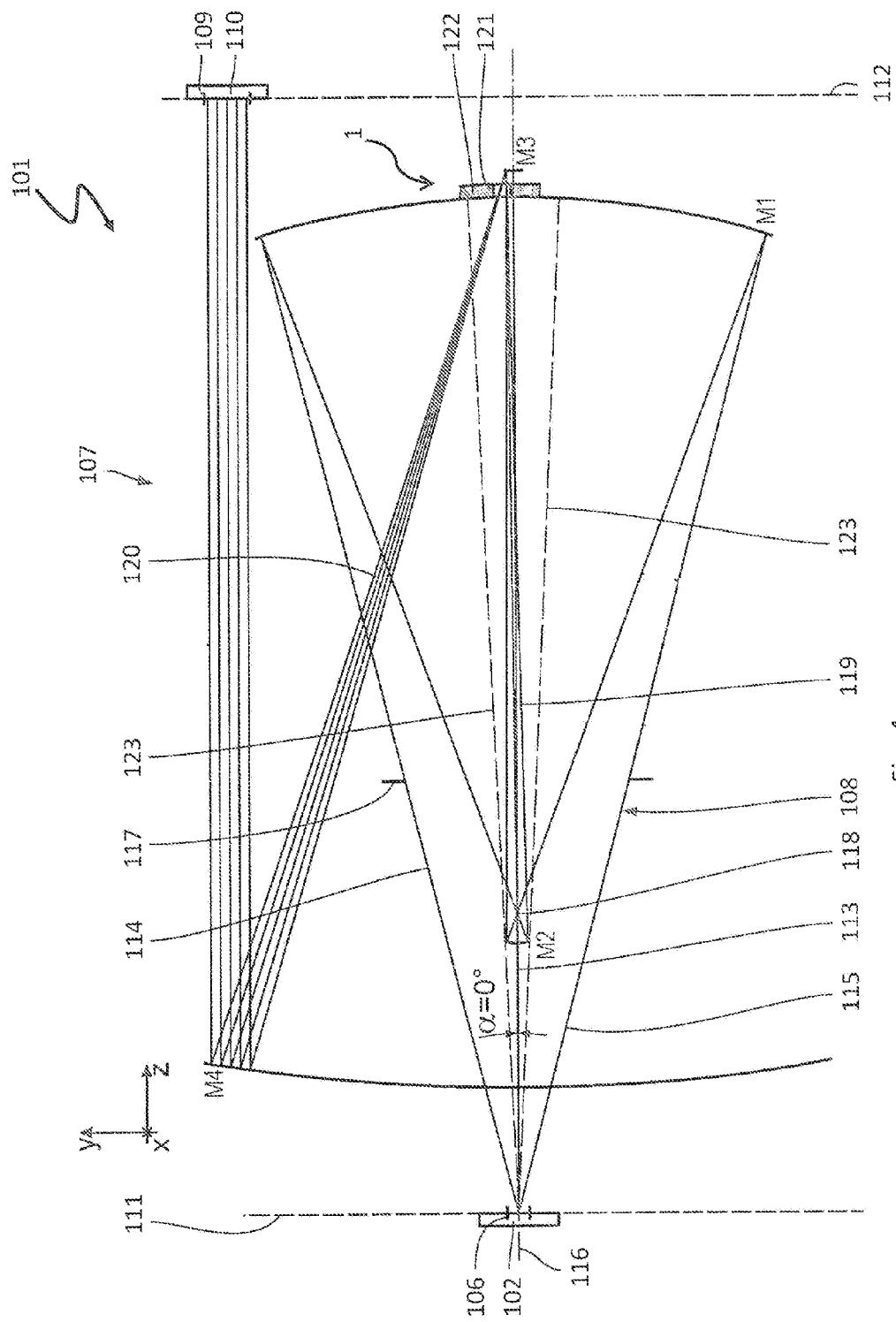
FIG. 4 shows a metrology system with a projection system, which has an optical assembly in accordance with FIG. 1, FIGS. 2A-2C or FIG. 3.

The optical assembly 1 shown in FIG. 1, FIGS. 2A-2C or FIG. 3 may be used in different optical systems. FIG. 4 shows such an optical system in the form of a projection system 107, which is integrated into a metrology system 101 which, in addition to the projection system 107, has an illumination system (not shown in the image) and a light source for illuminating an object field 106. The projection system 107 is embodied as described in conjunction with FIG. 3 in WO 2012/101269 A1, which was cited at the outset. The projection system 107 images the object field 106, which lies in an object plane 111 into an image field 109, which lies in an image plane 112, with a magnification factor of 750. An object in the form of a mask 102 is arranged in the object plane 111; a detector 110, for example in the form of a CCD detector, is arranged in the image plane 112. The projection system 107 is configured for a wavelength in the EUV wavelength range of 13.5 nm.

For the purposes of visualizing the imaging beam path 108 of the projection system 107, the course of chief rays 113 and of coma rays 114, 115, which emanate from five object field points arranged above one another in the y-direction of an xyz-coordinate system, are shown in FIG. 4. In the imaging beam path 108, the chief rays 113 emanate from a central object field point of the object plane 111 with a chief ray angle α of virtually 0° in relation to a normal 116 extending in a z-direction. In the imaging beam path 108, the projection system 107 has four mirrors M1 to M4 between the object field 106 and the image field 109. An aperture stop 117 is arranged in the imaging beam path 108 between the object field 106 and the first mirror M1 and an intermediate image 118 is situated in the imaging beam path 108 between the first mirror M1 and the second mirror M2. A first imaging partial beam 119 and a second imaging partial beam 120 both pass through a continuous opening 121 in a mirror body or in a substrate 122 of the first mirror M1 in the imaging beam path 108, said mirror body or substrate being depicted schematically in FIG. 4 only in the surroundings of the continuous opening 121.

The first mirror M1 is part of an optical assembly 1, as illustrated further above in conjunction with FIG. 1, FIGS. 2A-2C or FIG. 3. In the imaging beam path 108, the opening 121 is completely shadowed by the second mirror M2, as elucidated in FIG. 4 by two dashed shadow lines 123. The first imaging partial beam 119 and the second imaging partial beam 120 both pass through the continuous opening 121 in the first mirror M1 and are incident on the third mirror M3.

Figure 5:
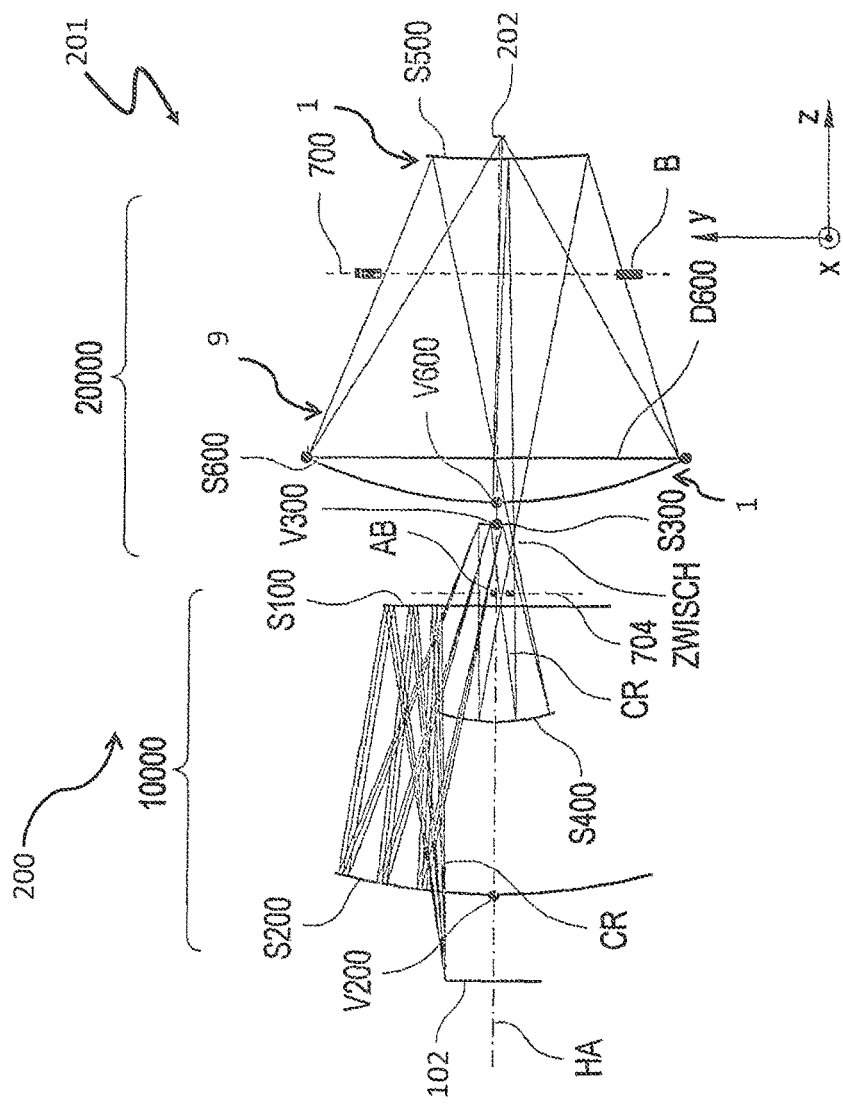
FIG. 5 shows an EUV lithography apparatus with a projection system, which has an optical assembly in accordance with FIG. 1, FIGS. 2A-2C or FIG. 3.

Finally, FIG. 5 shows the use of the optical assembly 1, described above in conjunction with FIG. 1, FIGS. 2A-2C or FIG. 3, in an imaging optical system in the form of an obscured projection system 200 of a microlithographic EUV lithography apparatus 201 which, in addition to the EUV projection system 200, also has an illumination system and a light source. The setup of the projection system 200 is described in detail in WO 2006/069725 A1 by the applicant (cf., therein, FIG. 17). The projection system 200 has six mirrors S100 to S600, of which four are arranged in a first partial lens 10000 and two are arranged in a second partial lens 20000, between which an intermediate image ZWISCH is formed. The second mirror S200 in the light path is embodied as a concave mirror with a vertex V200 in order to obtain low angles of incidence. The third mirror S300 is embodied as a convex mirror with a vertex V300.

The projection lens 200 has an aperture stop B, which is arranged in a stop plane 700 in the beam path between the fifth mirror S500 and the sixth mirror S600. A shading diaphragm AB defining the obscuration, i.e. the inner radius of the illuminated field, lies in a further stop plane 704 in the beam path between the third mirror S300 and the fourth mirror S400. The stop planes 700, 704 are conjugate to the entrance pupil of the projection lens 200 and emerge as the point of intersection of the chief ray CR with the optical axis HA of the projection lens 200. Both the fifth mirror S500 and the sixth mirror S600 each have an opening (not depicted in FIG. 4) through which the used radiation 9 in the form of EUV radiation passes.

Arranged in an object plane of the projection lens 200 is an object in the form of a mask 102, which is imaged with a reduced scale on the image plane, in which a wafer 202 which is exposed by the EUV lithography apparatus 201 is arranged. Both the fifth mirror S500 and the sixth mirror S600 are part of an optical assembly 1, which is embodied as described in conjunction with FIG. 1, FIGS. 2A-2C or FIG. 3. It is understood that the first four mirrors S100 to S400, which do not have an opening, may form part of an optical assembly 1, which is embodied as described in conjunction with FIG. 1, FIGS. 2A-2C or FIG. 3, instead of the fifth mirror S500 and sixth mirror S600. Also, other elements, for example transmissive optical elements in the form of lens elements or the like, which are integrated into the optical assembly 1 described further above, may be purged by using a purge gas 18 instead of mirrors 2.

What is claimed is:

1. An optical assembly, comprising:
   an optical element,
   a mount configured to hold the optical element,
   a plurality of fastening elements with fastening areas configured to fasten the optical element to the mount, wherein the fastening elements extend from the mount to the optical element so as to bridge a ring-shaped interstice between a radially outer edge of the optical element and a radially inner edge of the mount, and
   a purge device arranged at an upper side of the optical element to produce at least one purge gas flow originating at and directed onto the upper side of the optical element, such that the purge gas flow flows around the fastening areas of the fastening elements,
   wherein the optical element has an optically used region on the upper side of the optical element and at least one hole through the optically used region, and
   wherein a flow guiding element is fastened outside the optically used region, to the optical element and/or to the mount, and covers the ring-shaped interstice between the optical element and the mount.

2. The optical assembly according to claim 1, wherein the purge device is configured to produce a purge gas flow which passes through the interstice.

3. The optical assembly according to claim 1, wherein the flow guiding element consists of a metallic material.

4. The optical assembly according to claim 1, wherein the flow guiding element seals the interstice in a gas-tight manner.

5. The optical assembly according to claim 1, wherein the optical element is fastened to fastening areas of the fastening elements with an adhesive and/or a joining agent other than the adhesive.

6. The optical assembly according to claim 1, wherein the optical element is a mirror comprising a substrate and a reflecting coating applied to the substrate.

7. The optical assembly according to claim 6, wherein the flow guiding element is fastened to a side of the substrate facing away from the reflecting coating.

8. The optical assembly according to claim 1, wherein the flow guiding element is configured as a membrane which is fastened to the optical element and to the mount outside of an optically used region of the optical element.

9. The optical assembly according to claim 8, wherein the membrane is fastened to the optical element outside of the optically used region with an adhesive and/or a joining agent other than the adhesive.

10. The optical assembly according to claim 9, wherein the adhesive and/or the joining agent forms a zigzag track on the optical element.

11. The optical assembly according to claim 8, wherein the membrane has a thickness of less than 50 µm.

12. The optical assembly according to claim 1, wherein a ring-shaped gap is formed between the flow guiding element and the optical element or between the flow guiding element and the mount, forming a passage of the purge gas flow.

13. The optical assembly according to claim 12, wherein the optical element and/or the mount has/have a recess configured to receive the flow guiding element.

14. The optical assembly according to claim 1, further comprising a transparent membrane which completely covers the hole.

15. The optical assembly according to claim 1, wherein the purge device is configured to produce a purge gas flow which passes through the hole.

16. The optical assembly according to claim 1, wherein the purge device comprises a distributor device configured to distribute a purge gas among a first purge gas flow guided through the hole and a second purge gas flow guided in the interstice.

17. The optical assembly according to claim 16, wherein the flow guiding element comprises two distributor flow guiding elements arranged at a distance from the optical element, wherein gaps are formed respectively between each of the two distributor flow guiding elements and the optical element and wherein the purge device is configured to allow the purge gas to flow in between the two distributor flow guiding elements in a direction of the optical element, to distribute the two purge gas flows.

18. A projection system comprising at least one optical assembly according to claim 1.

19. An extreme-ultraviolet lithography apparatus comprising a projection system according to claim 18.

20. A microlithographic metrology system comprising at least one optical assembly according to claim 1.

21. The optical assembly according to claim 1, wherein the fastening elements extend in a radial direction towards the optical element.

22. The optical assembly according to claim 1, wherein the flow guiding element completely separates a space on the upper side of the optical element from a space on a lower side of the optical element.

\* \* \* \* \*